(12) United States Patent
Berman et al.

(10) Patent No.: US 10,726,879 B2
(45) Date of Patent: Jul. 28, 2020

(54) LOW-POWER DATA TRANSFER FROM BUFFER TO FLASH MEMORY

(71) Applicant: SAMSUNG ELECTRONICS CO., LTD., Suwon-si, Gyeonggi-do (KR)

(72) Inventors: Amit Berman, Ramat Gan (IL); Junjin Kong, Yongin-si (KR); Uri Beitler, Ramat Gan (IL)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/836,067

(22) Filed: Dec. 8, 2017

(65) Prior Publication Data

US 2019/0180793 A1 Jun. 13, 2019

(51) Int. Cl.

| G11C 5/14 | (2006.01) |
| G11C 11/24 | (2006.01) |
| G11C 11/00 | (2006.01) |
| G06F 3/06 | (2006.01) |
| G11C 7/04 | (2006.01) |
| G11C 11/56 | (2006.01) |
| G11C 16/10 | (2006.01) |
| G11C 16/30 | (2006.01) |
| G11C 11/4093 | (2006.01) |

(52) U.S. Cl.
CPC ............ G11C 5/141 (2013.01); G06F 3/0619 (2013.01); G11C 5/143 (2013.01); G11C 7/04 (2013.01); G11C 11/005 (2013.01); G11C 11/24 (2013.01); G11C 11/5628 (2013.01); G11C 16/10 (2013.01); G11C 16/30 (2013.01); *G11C 11/4093* (2013.01); *G11C 2211/5641* (2013.01)

(58) Field of Classification Search
CPC ....... G11C 5/141; G11C 11/005; G11C 11/24; G11C 11/4093; G06F 3/0619
USPC ........................................................ 365/228
See application file for complete search history.

(56) References Cited

U.S. PATENT DOCUMENTS

| 8,745,421 B2 * | 6/2014 | Miller ...................... G06F 1/30 713/300 |
| 9,208,894 B2 | 12/2015 | Lee et al. |
| 9,348,539 B1 * | 5/2016 | Saxena .................... G11C 5/04 |
| 9,465,426 B2 | 10/2016 | Li |
| 9,558,839 B2 | 1/2017 | Thompson et al. |

(Continued)

FOREIGN PATENT DOCUMENTS

JP 2013061791 4/2013

OTHER PUBLICATIONS

Tseng, et al., "Understanding the Impact of Power Loss on Flash Memory", DAC2011 (6 pages).

*Primary Examiner* — Tha-O H Bui
(74) *Attorney, Agent, or Firm* — F. Chau & Associates, LLC

(57) ABSTRACT

A solid-state drive (SSD) may include a volatile buffer such as DRAM, a non-volatile memory (NVM) such as NAND Flash connected to the volatile buffer, and a capacitor connected to both, where the capacitor may have an energy capacity insufficient to supply the buffer and NVM using a normal supply voltage in a normal mode, but sufficient to supply the buffer and NVM using at least one reduced supply voltage in a temporary mode; and a related method may include programming data to the NVM by temporarily reducing the supply voltage to the NVM, and writing data to the NVM using the reduced supply voltage.

20 Claims, 5 Drawing Sheets

(56) References Cited

U.S. PATENT DOCUMENTS

| | | |
|---|---|---|
| 2007/0033432 A1 | 2/2007 | Pecone et al. |
| 2013/0039141 A1 | 2/2013 | Smith et al. |
| 2014/0258755 A1 | 9/2014 | Stenfort |
| 2016/0268000 A1* | 9/2016 | Thompson .............. G11C 16/30 |
| 2017/0090538 A1* | 3/2017 | Wang ........................ G11C 5/14 |
| 2019/0079125 A1* | 3/2019 | Abrahams .......... G01R 31/3004 |

* cited by examiner

US 10,726,879 B2

LOW-POWER DATA TRANSFER FROM BUFFER TO FLASH MEMORY

TECHNICAL FIELD

Embodiments of the present disclosure relate to solid-state drive (SSD) architectures. More particularly, exemplary embodiments relate to enterprise SSD, DRAM buffers, V-NAND Flash technology, sudden power-off, low-power algorithms, and backup capacitors.

DISCUSSION OF RELATED ART

In enterprise SSD, a DRAM buffer may be deployed for performance acceleration. During sudden power-off, meta-data and cache are written to NAND Flash using the energy that is supplied by a backup capacitor. The capacity of the backup capacitor is dictated by the energy required to back up the DRAM to the NAND Flash. For increasing energy capacities, the SSD backup capacitor may be more expensive, or the reliability of the capacitor may be more limited. For example, a tantalum electrolytic capacitor is a polarized capacitor having an anode electrode (+) made of tantalum on which a very thin insulating oxide layer is formed, where the oxide layer acts as the dielectric of the capacitor. A solid or liquid electrolyte, which covers the surface of the oxide layer, is the cathode electrode (−) of the capacitor. Incorporation of tantalum capacitors in SSD is relatively expensive, but because of their very thin and relatively high permittivity dielectric layer, tantalum capacitors may have relatively higher capacitance per volume and lower weight than other electronic energy storage devices.

SUMMARY

An exemplary embodiment method for programming data from a volatile buffer to a non-volatile memory (NVM) includes detecting a power loss; temporarily reducing a supply voltage to the NVM; and writing data to the NVM using the reduced supply voltage upon detection of the power loss. The method may be applied where the NVM uses a variable number of bits per cell (BPC), and further include reducing the number of BPC used in the NVM to write data during the temporary mode, and storing meta-data in the NVM indicative of the reduced number of BPC.

The method may be applied where the volatile buffer and the NVM are comprised by a solid-state drive (SSD). The method may be applied where the volatile buffer comprises a dynamic random-access memory (DRAM). The method may be applied where the NVM comprises NAND Flash storage. The method may be applied where the NVM comprises V-NAND Flash technology.

The method may be applied where the temporarily reduced supply voltage is supplied by a capacitor. The method may be applied where the temporarily reduced supply voltage is supplied by a tantalum capacitor.

An exemplary embodiment solid-state drive (SSD) includes a volatile buffer; a non-volatile memory (NVM) connected to the volatile buffer; and a capacitor connected to both the volatile buffer and the NVM, where the capacitor has an energy capacity insufficient to supply the buffer and NVM using a normal supply voltage in a normal powered mode, but sufficient to supply the buffer and NVM using at least one reduced supply voltage in a temporary power loss mode.

The SSD may have a NVM that includes a variable number of levels per cell. Such an SSD may include circuitry for reducing the number of levels per cell used in the NVM to write data during the temporary mode; and circuitry for storing meta-data in the NVM indicative of the reduced number of levels per cell.

The SSD may have a volatile buffer comprising a dynamic random-access memory (DRAM). The SSD may have a NVM comprising NAND Flash storage. The SSD may have a NVM comprising V-NAND Flash technology. The SSD may have a capacitor comprising a tantalum anode.

An exemplary embodiment program storage device is provided, tangibly embodying a program of instruction steps executable by a processor for programming data in a solid-state drive (SSD) from a DRAM cache to a V-NAND Flash, the instruction steps comprising: selecting a reduced supply voltage that temporarily reduces total SSD energy required for programming the data from the DRAM cache to the V-NAND Flash; detecting an external power loss; and programming the data from the DRAM cache to the V-NAND Flash using the selected reduced supply voltage upon detection of the external power loss.

The instruction steps may include selecting the reduced supply voltage that temporarily reduces total SSD energy required for programming the data from the DRAM cache to the V-NAND Flash to that available from a super-capacitor of the SSD. The instruction steps may include selecting a bits-per-cell (BPC) mode that temporarily minimizes energy per bit-write to the V-NAND Flash and programming the data from the DRAM cache to the V-NAND Flash using the selected BPC mode and reduced supply voltage during power loss to the SSD. The instruction steps may include detecting a power loss to the SSD; determining the energy requirements of the active incomplete processes of the SSD; and selecting the reduced supply voltage that temporarily reduces total SSD energy required for programming the data from the volatile buffer to the V-NAND Flash to that available from a capacitor of the SSD less that required for the active incomplete processes.

The instruction steps may include adjusting the V-NAND flash voltage scaling at least once during power-loss to extend capacitor power for programming of cache data based on a latency versus power trade-off that leads to minimal energy consumption. The instruction steps may include adjusting supply voltage scaling for read from DRAM and again for write to V-NAND Flash during a reduced-power mode to extend capacitor power for programming of cache data based on a latency versus power trade-off. The instruction steps may include detecting a stressful temperature condition within the SSD; and invoking temperature protection by adjusting at least one of the BPC mode or supply voltage to protect the cache data and mitigate the stressful temperature condition using the adjusted BPC mode or supply voltage. The instruction steps may include extending on-SSD capacitor lifetime by providing chip power scaling and low-power programming to reduce at least one of temperature cycling or energy cycling of the capacitor. The instruction steps may include performing expedited DRAM data programming to V-NAND without a verification operation. The instruction steps may include writing the DRAM cache data to a portion of the V-NAND Flash requiring the lowest write duration for the current temperature, BPC, or supply voltage.

BRIEF DESCRIPTION OF THE DRAWINGS

Aspects of the present disclosure may be appreciated upon consideration of the following description of exemplary embodiments when taken in conjunction with the accompanying drawings, in which.

DETAILED DESCRIPTION

A low-power algorithm is provided for writing a DRAM buffer to NAND Flash storage during power-off. This algorithm may enable cost-effective solid-state drive (SSD) technology. In particular, embodiments of the present disclosure may reduce the cost of a super-capacitor in SSDs, and/or accelerate DRAM data programming to NAND Flash in case of power loss.

Figure 1:
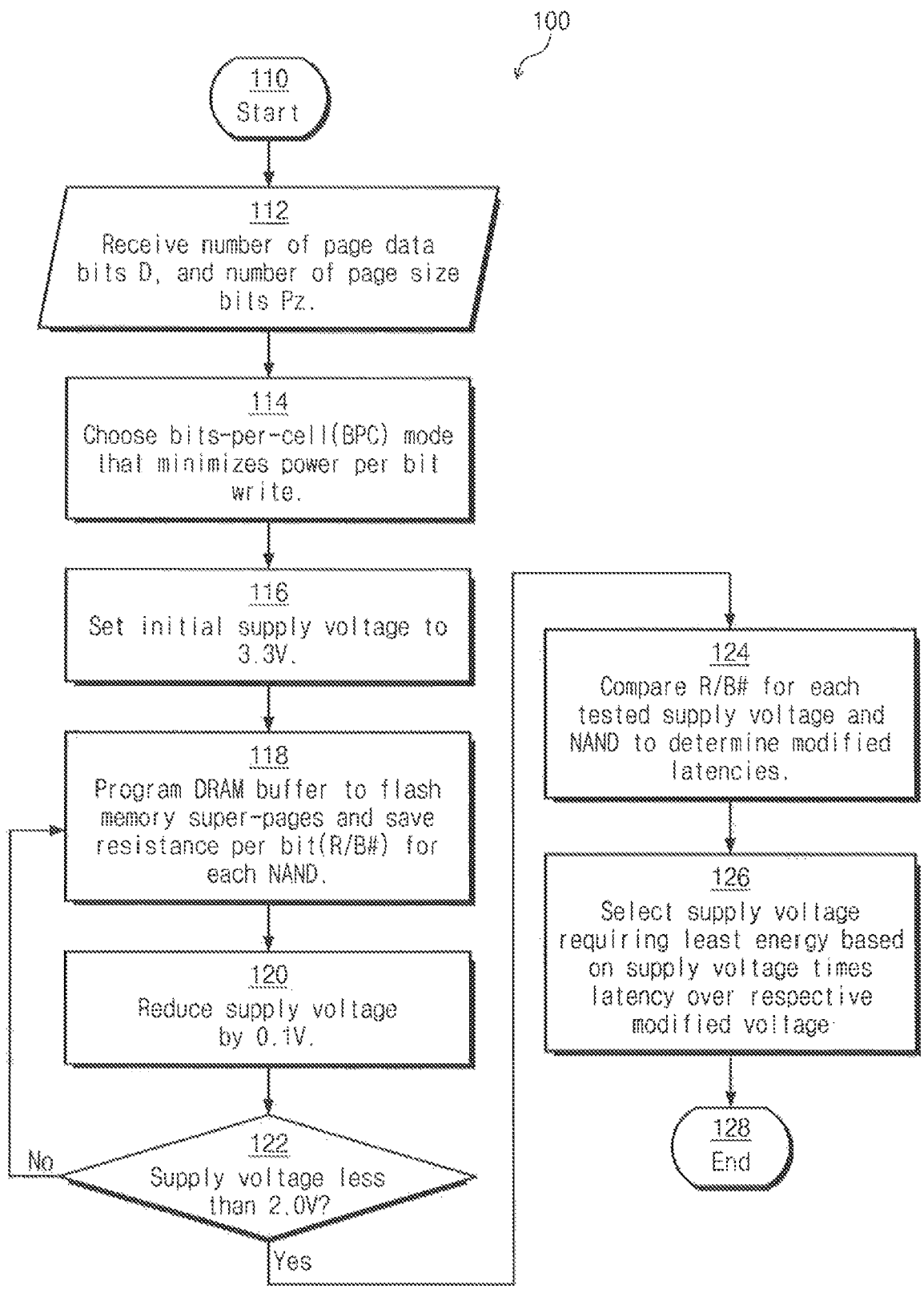
FIG. 1 is schematic flow diagram of a method for energy reduction in data transfer from DRAM buffer to NAND Flash storage in accordance with an exemplary embodiment of the present disclosure.

As shown in FIG. 1, a method for energy reduction in data transfer from DRAM buffer to NAND Flash storage is indicated generally by the reference numeral 100. Here, a start block 110 passes control to an input block 112. The input block 112 receives the number of page data bits D and the number of page size bits $P_z$, and passes control to a function block 114. The function bock 114 selects the bits-per-cell (BPC) mode that minimizes energy per bit write, and passes control to a function block 116. The function block 116 sets the initial supply voltage to an upper limit such as 3.3 V, and passes control to a function block 118.

The function block 118, in turn, programs the DRAM buffer to the Flash storage super-pages, saves the latency per page program (R/B #) for each NAND, and passes control to a function block 120. The function block 120 reduces the supply voltage by a decrement such as 0.1 V, and passes control to a decision block 122. The decision block 122 determines whether the supply voltage is less than a lower limit such as 2.0 V, and if not, passes control back to the function block 118. If the supply voltage is less than 2.0 V, for example, then the decision block 122 passes control to a function block 124.

The function block 124, in turn, compares the latency per page program (R/B #) for each tested supply voltage and NAND to determine modified latencies, and passes control to a function block 126. The function block 126 selects the supply voltage requiring the least energy based on supply voltage times latency over respective modified voltage, and passes control to an end block 128. Here, the variable being minimized is the energy consumed within the NAND per page program.

Figure 2:
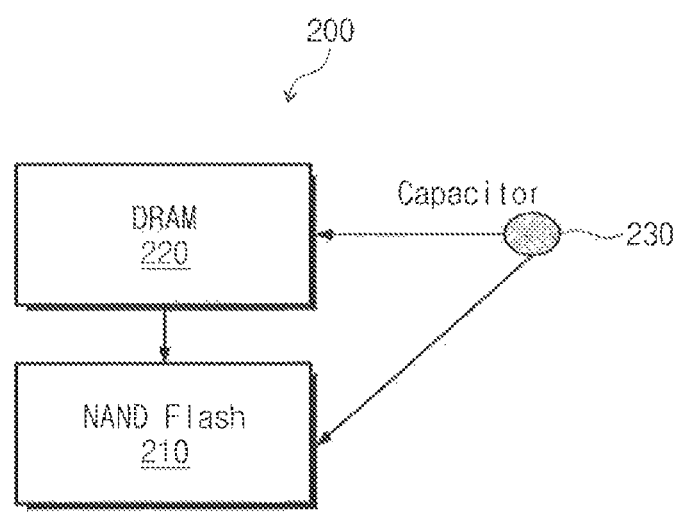
FIG. 2 is schematic block diagram of a solid-state drive (SSD) with DRAM buffer and NAND Flash storage in accordance with an exemplary embodiment of the present disclosure.

Turning to FIG. 2, a solid-state drive (SSD) with DRAM buffer and NAND Flash storage is indicated generally by the reference numeral 200. Here, the SSD 200 includes a NAND Flash 210, a DRAM 220 connected to the NAND Flash, and a capacitor 230 connected to both the NAND Flash 210 and the DRAM 220. The type and capacity of capacitor used is dependent upon the total amount of energy needed to write the contents of the DRAM to the NAND Flash upon complete loss of external power.

Figure 3:
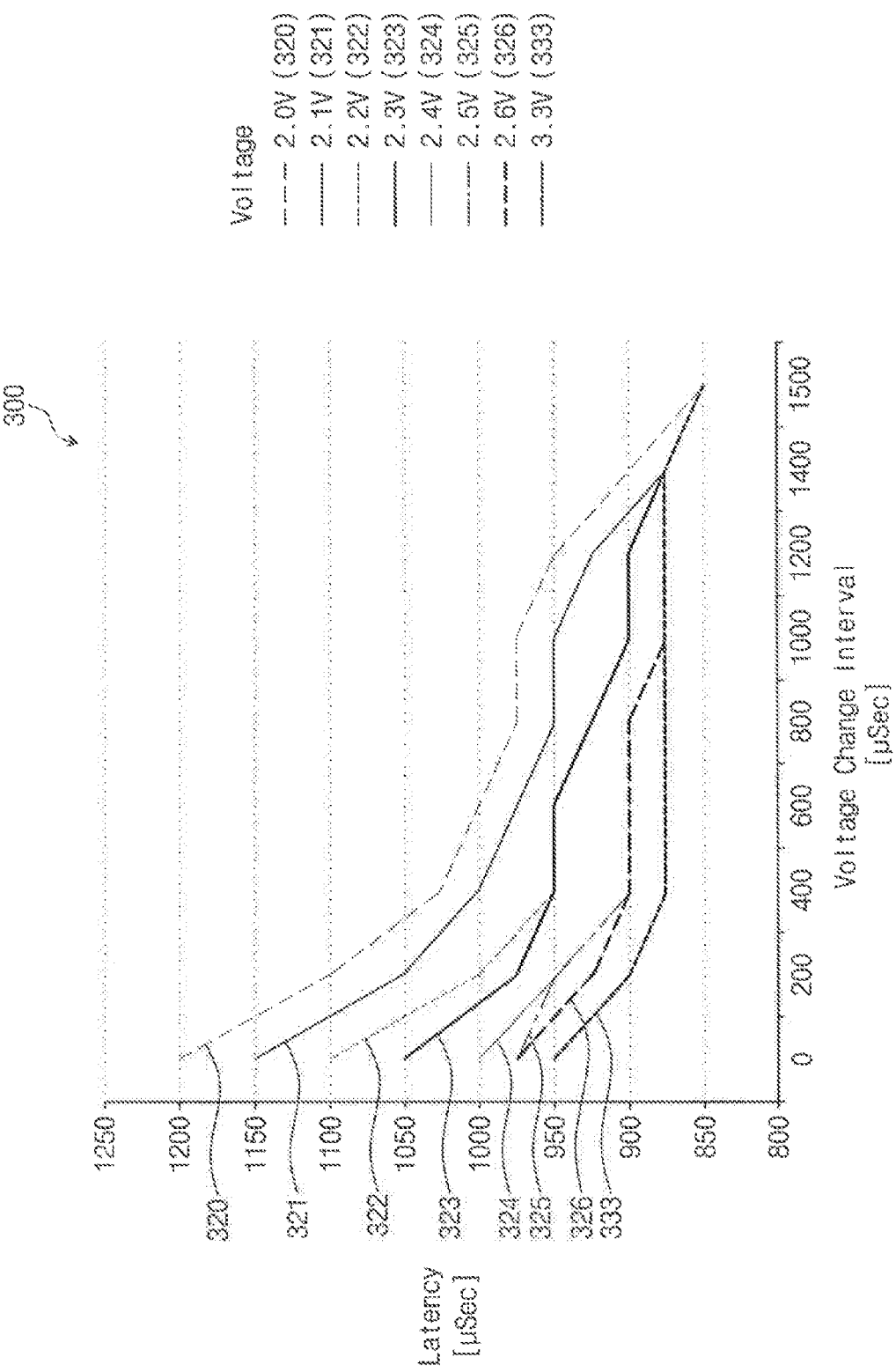
FIG. 3 is a time-wise graphical diagram of latency versus voltage change interval for different supply voltages in accordance with exemplary embodiments of the present disclosure.

Turing now to FIG. 3, a time-wise plot of latency versus voltage change interval for different supply voltages is indicated generally by the reference numeral 300. Here, a 2.0 V supply voltage is plotted along the curve 320. A 2.1 V supply voltage is plotted along the curve 321. A 2.2 V supply voltage is plotted along the curve 322. A 2.3 V supply voltage is plotted along the curve 323. A 2.4 V supply voltage is plotted along the curve 324. A 2.5 V supply voltage is plotted along the curve 325. A 2.6 V supply voltage is plotted along the curve 326. And a 3.3 V supply voltage is plotted along the curve 333. When all else is equal, the lower the supply voltage, the higher the latency.

Figure 4:
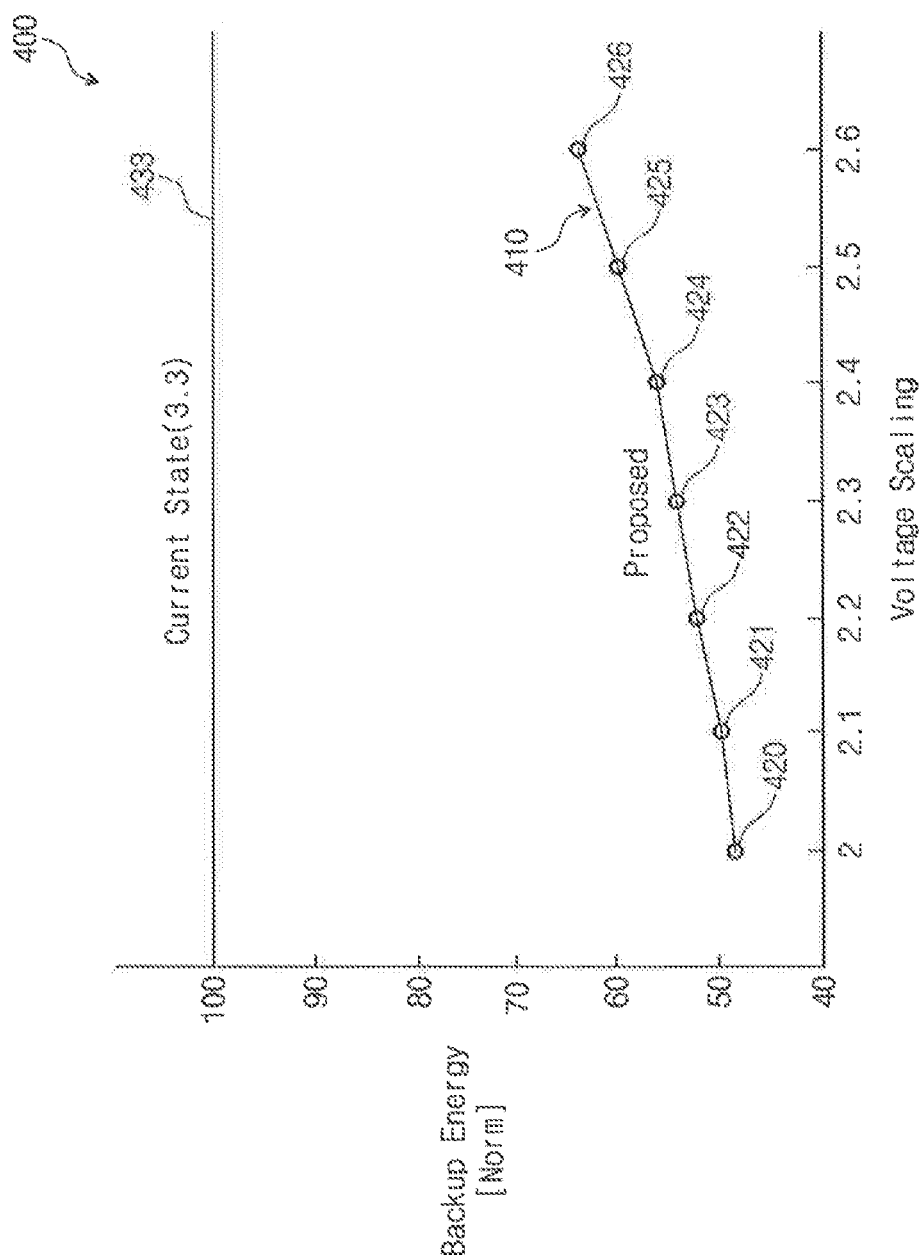
FIG. 4 is a graphical diagram of normative backup energy versus supply voltage scaling in accordance with exemplary embodiments of the present disclosure.

As shown in FIG. 4, a plot of normative backup energy versus supply voltage scaling is indicated generally by the reference numeral 400. A curve 410 shows the generally increasing energy requirements for increasing supply voltage. From least to most backup energy needed, the point 420 indicates the lowest energy requirement for a supply voltage of 2.0 V, the point 421 indicates the slightly higher energy requirement for a supply voltage of 2.1 V, the point 422 indicates the slightly higher energy requirement for a supply voltage of 2.2 V, the point 423 indicates the slightly higher energy requirement for a supply voltage of 2.3 V, the point 424 indicates the slightly higher energy requirement for a supply voltage of 2.4 V, the point 425 indicates the slightly higher energy requirement for a supply voltage of 2.5 V, and the point 426 indicates the slightly higher energy requirement for a supply voltage of 2.6 V. The level line 433 shows the normative backup energy requirement of 100% for a traditional fixed 3.3 V supply voltage. Here, the backup energy required for the 2.0 V supply voltage is reduced to 52% of norm without even considering bit-level reductions.

In operation compared to a typical enterprise SSD, which may contain a large capacitor to enable programming of DRAM data to Flash during power-loss, embodiments of the present disclosure may reduce or potentially eliminate the SSD capacitor by dynamically changing the supply voltage VDD of NAND Flash within the SSD upon power loss and potentially during different phases of program activity. The reduced power dissipation may extend latency in some embodiments or reduce it in others, but total energy consumption drops using embodiments of the presently disclosed low-power programming algorithm. Thus, an SSD super-capacitor may be replaced with a smaller and/or more cost-effective energy storage device.

The present disclosure provides a low-power program algorithm that enables substitution of such backup capacitor with a smaller and/or more cost-effective capacitor, for example, without compromising reliability. Exemplary embodiments use voltage scaling of the NAND devices upon power-off, which may trade-off increased latency in some embodiments for reduced energy, as well as optimizing the number of bits per cell upon power-off, which may reduce latency in some embodiments. Analysis shows that the required energy to program DRAM data may be reduced by at least half (e.g., 52%) using these means. The method may further entail over-provisioning redundancy and NAND controller support.

Embodiments of the present disclosure may be applied in addition to density improvement by device scaling, layering in 3D NAND or V-NAND, and multi-bit per cell architectures, to enhance reliability and reduce costs per gigabyte. Embodiments of the present disclosure may significantly reduce the cost of a backup capacitor that is used to energize storage of a temporary DRAM buffer during sudden power-off. The required capacitance, corresponding energy and/or cost may be derived from the required SSD power for DRAM buffer copy to non-volatile NAND.

Analysis revealed that more than 95% of the power may be consumed by NAND program operation. The initial approach was to reduce the required energy by using additional redundancy and temporarily lower drive performance during power-off. The scheme is based on voltage scaling of the SSD NAND components during Flash programming. There is an initial tradeoff between reduced write energy and increased latency, which may, in turn, be partially, fully, or over-compensated using a reduced number of bits per cell in another trade-off between reduced latency and reduced incremental storage capacity for the small portion of Flash programmed during power-off.

The SSD cache backup is relatively small, so latency performance has insignificant impact other than for energy savings. Since the voltage can be scaled at each part of the program operation and for various values, there may be an optimal working point for minimal energy consumption in each application. Moreover, the energy can be further conserved by selecting the number of charge levels per cell that provides the lowest energy per bit ratio. This second approach results in a capacity-energy trade-off that may be used for backup purposes, for example. The two optimizations are complementary and form the presently disclosed algorithmic framework for NAND power reduction.

The following notations and definitions may be used:

SSD Power Consumption: The power that is consumed by the SSD consists of the sum of static and dynamic power of DRAM, controller, NANDs components and the corresponding energy dissipation on links and host inputs and outputs. The power varies according to the operation that is performed, frequency, and the number of planes in NANDs that are active.

Static and Dynamic Power: The static power is dissipated when the SSD is in an idle state (i.e., not performing any task including garbage collection). Dynamic power is dissipated during active read/program/erase or internal operations.

Required energy (E) for Sudden Power-Off Buffer (SPOB) programming: The required energy for DRAM cache programming to NAND Flash non-volatile storage depends on the power state and its duration as set forth in Equation 1:

$$E_{SPOB} = \int_0^{t'} P_{REQ}(t)dt = P_{REQ} \cdot T_{REQ} \qquad \text{(Eqn. 1)}$$

SSD component architecture parameters: $S_B$—DRAM buffer size in Bytes that is used to store temporary data before programming and has to be written to non-volatile memory (NVM) during power loss. $W_Z$—word-line size in number of cells. In single-level cell (SLC) mode, $W_Z$ is equal to the number of bits per word-line. $N_{Ch}$— number of channels. $N_{Wy}$—number of NAND components (ways) per channel. $N_{Pn}$—number of independent NVM arrays (planes) inside NAND Flash IC. $t_{PROG}$—typical word-line program time in seconds. $t_{Latency}$—duration in seconds for transferring DRAM buffer to NAND Flash until single super-page with all planes is filled. $t_{Delay}$—remaining duration in seconds of the previous activity prior to sudden power-off.

SSD energy parameters: $P_{DRAM}$—the average power consumption during DRAM read. $P_{CTR}$—the average power consumption for controller operation during write. $P_{NAND}$—the average power consumption for NAND flash plane during write. $P_{LINK}$—the average power consumption for SSD wires during write.

The power modeling consists of two components: the required time to hold the supply voltage to SSD system as described in Section A; and the corresponding required power to be supplied for full compatibility with alternative capacitor as described in Section B. The total required energy and backup capacitance are calculated in Section C. Additional modeling regarding voltage versus latency and storage-capacity versus latency trade-offs are provided in Sections D and E, respectively.

A. Voltage Supply Time

The duration of valid voltage supply to NAND is denoted with $T_{REQ}$ as set forth in Equation 2:

$$T_{REQ} = \frac{S_B}{W_Z \cdot N_{Ch} \cdot N_{Wy} \cdot N_{Pn}} \cdot t_{PROG} + t_{Latency} + t_{Delay} \qquad \text{(Eqn. 2)}$$

The latency time may be included in the delay parameter. Since latency is negligible compared to delay (microseconds versus milliseconds), the difference is small. For considering the worst-case, in which two TLC program operations both using the cache program are to be executed prior to sudden power-off, and assuming that backup data is programmed to SLC, the required time is set forth in Equation 3:

$$T_{REQ} \approx \frac{S_B}{W_Z \cdot N_{Ch} \cdot N_{Wy} \cdot N_{Pn}} \cdot t_{PROG\text{-}SLC} + 2 \cdot t_{PROG\text{-}TLC} \qquad \text{(Eqn. 3)}$$

For example, in an exemplary SSD, the parameter values are as set forth in Table A:

TABLE A

| Parameter | Value |
| --- | --- |
| $S_B$ | 10 [MByte] |
| $W_Z$ | 16 [KByte] |
| $N_{Ch}$ | 8 |
| $N_{Wy}$ | 8 |
| $N_{Pn}$ | 2 |
| $t_{PROG}$ | SLC - 0.5 [mSec] |
| | MLC - 0.85[mSec] |
| | TLC - 1.5 [mSec] |
| $t_{Delay}$ | 3 [mSec] |
| $t_{Latency}$ | 100 [μSec] |
| Calc. $T_{REQ}$ | 8 [mSec] |

In a worst-case scenario, the sudden power-off occurs when NANDs are at the beginning of a super-page program operation. An erase operation that is managed as part of the garbage collection process is considered only for a small subset of the NANDs, and therefore its delay contribution to a buffer emergent backup may be omitted.

B. Power Requirements

The required energy for backup of DRAM is denoted by $P_{REQ}$. This is the SSD energy during write without accepting additional interface instructions and includes the structural terms set forth in Equation 4:

$$P_{REQ} = P_{DRAM} + P_{CTR} + N_{Ch} \cdot N_{Wy} \cdot N_{Pn} \cdot P_{NAND} + P_{LINK} \qquad \text{(Eqn. 4)}$$

An exemplary SSD is the Samsung SM863. The SM863 SSD is an 8-Channel, 8-Way SSD with the specification of 3.1 Watts RMS per 128 KB active write state. Assuming SLC mode turbo-write NAND with 8 KB cells per word-line (8 KB data), the power per NAND is (3.1-0.3)/(128/8)=175 mWatt. Reported write power of Flash MLC/TLC NVM ranges between 50 to 200 mW. For example, planar KOLD/HF MLC NAND has 2.7-3.6 V power supply and 45-50 mA, yielding 120-180 mW power consumption, where a further 50% power reduction may be achieved by using VNAND, yielding 60-90 mW. The datasheet for K4T1 1 Gb DDR2 SDRAM specifies 1.8 V power supply and 70-80 mA burst read current, yielding 126-144 mW power consumption. 150 mW for controller and DRAM power parameter was used. In summary, the values for an exemplary SSD are set forth in Table B:

TABLE B

| Parameter | Value |
| --- | --- |
| $P_{DRAM}$ (read) | 150 [mW] |
| $P_{CTR}$ | 150 [mW] |
| $P_{NAND}$ (write) | 175 [mW] |
| $P_{LINK}$ | 100 [µW] |
| Spec. $P_{WR}$ | 3.1 [W] |
| Superpage $P_{REQ}$ | 22.7 [W] |

C. Required Energy and Capacitor Solution

The energy requirement for buffer back-up of the above-described example is:

$$E_{SPOB} = P_{REQ} \cdot T_{REQ} = 22.7 \cdot 8 \cdot 10^{-3} = 0.18 [J] \quad \text{(Eqn. 5)}$$

The formula and calculation of the required backup capacitance for optimized low-energy consumption using an end voltage of 2.7 V is:

$$C_{Cap} = \frac{2 \cdot T_{REQ} \cdot P_{REQ}}{(V_I^2 - V_F^2)} = \frac{2 \cdot E_{SPOB}}{(V_I^2 - V_F^2)} = \frac{2 \cdot 8 \cdot 10^{-3} \cdot 22.7}{(3.3^2 - 2.7^2)} = 100 [mF] \quad \text{(Eqn. 6)}$$

Thus, the required capacitance is 100 mF for a supply voltage of 2.7 V. If the capacitor lower voltage is alternatively optimized for low-latency using an end voltage of 3.2 V, then the required capacitance increases to 558 mF for that supply voltage of 3.2 V. Additional safety margins may be added to compensate for the degradation of a capacitor over an increasing number of discharge cycles and/or fluctuating temperatures.

D. Voltage-Latency Relation

Referring back to FIG. 3, latency results are indicated generally by the reference numeral 300. Here, the impact of low voltage supply on program latency and bit-error rate (BER) was researched. Table C shows the latency data of FIG. 3 in tabular form.

TABLE C

| Interval | Voltage Supply [Volts] | | | | | | | |
| --- | --- | --- | --- | --- | --- | --- | --- | --- |
| [µSec] | 2.0 V | 2.1 V | 2.2 V | 2.3 V | 2.4 V | 2.5 V | 2.6 V | 3.3 V |
| 0 | 1200 | 1150 | 1100 | 1050 | 1000 | 975 | 975 | 950 |
| 200 | 1100 | 1050 | 1000 | 975 | 950 | 950 | 925 | 900 |
| 400 | 1025 | 1000 | 950 | 950 | 900 | 900 | 900 | 875 |
| 600 | 1000 | 975 | 950 | 950 | 900 | 900 | 900 | 875 |
| 800 | 975 | 950 | 925 | 925 | 900 | 900 | 900 | 875 |
| 1000 | 975 | 950 | 900 | 900 | 875 | 875 | 875 | 875 |
| 1200 | 950 | 925 | 900 | 900 | 875 | 875 | 875 | 875 |
| 1400 | 900 | 875 | 875 | 875 | 875 | 875 | 875 | 875 |
| 1500 | 850 | 850 | 850 | 850 | 850 | 850 | 850 | 850 |

Power function results are shown in Table D. Here, polynomial regression was used to characterize the power function.

TABLE D

Polynomial Regression of Latency-Voltage Relation (Silicon Experience Results)

1.8 V  y = 0.463$x^3$ − 18.849$x^2$ + 128.31x + 880.56 $R^2$ = 0.9932; x ≥ 600
1.9 V  y = 0.2315$x^3$ − 8.5317$x^2$ + 34.689x + 1058.1 $R^2$ = 0.9914; x ≥ 600
2.0 V  y = −1.936$x^3$ + 31.733$x^2$ − 185.93x + 1356.3 $R^2$ = 0.9963
2.1 V  y = −1.4941$x^3$ + 24.955$x^2$ − 151.53x + 1273 $R^2$ = 0.9904
2.2 V  y = −1.2837$x^3$ + 22.475$x^2$ − 138.74x + 1209.7 $R^2$ = 0.9815
2.3 V  y = −0.8418$x^3$ + 14.141$x^2$ − 89.184x + 1118.1 $R^2$ = 0.9749
2.4 V  y = −0.8628$x^3$ + 15.323$x^2$ − 93.338x + 1078.4 $R^2$ = 0.9703
2.5 V  y = −0.5682$x^3$ + 10.146$x^2$ − 65.476x + 1033.9 $R^2$ = 0.9551
2.6 V  y = −0.7155$x^3$ + 12.166$x^2$ − 71.642x + 1031.2 $R^2$ = 0.9591
3.3 V  y = −1.0311$x^3$ + 17.172$x^2$ − 90.13x + 1022.2 $R^2$ = 0.9874

The processed trade-off enables estimation of the power reduction due to voltage reduction, and multiplying it by the new write latency to achieve low-energy programming. The optimization process and formulation are discussed below. The program BER of the programmed data was shown to remain substantially unchanged using the voltages in Table D. There may be a trade-off in retention characteristics from several years to several months, but it may be assumed that recovery after sudden power-off will be handled to restore past data well within these reduced retention times, such as within a matter of hours or days. Therefore, using the voltage-scaling approach in such applications is unlikely to incur additional data errors.

E. Capacity-Latency Relation

Since SSD is initially optimized for capacity, the maximum possible number of bits per cell is typically used. However, during sudden power-off, the exemplary embodiment control program is willing to spend modest storage capacity (e.g., 10 MB) to achieve a further reduction in energy requirements. Therefore, the energy per bit program ratio may be checked for any number of charge levels, and the backup program may use the optimized energy write with corresponding capacity penalty. The optimized number of bits-per-cell (BPC) has a certain page programming power and duration ($P_{PROG}$, $t_{PROG}$) for word-line length $S_{WL}$ and L charge levels per cell that achieve the minimum for the following expression:

$$BPC = \min_{(SLC,MLC,TLC)} \frac{P_{PROG} \cdot t_{PROG}}{S_{WL} \cdot \log_2(L)} \quad \text{(Eqn. 7)}$$

It shall be understood that choosing BPC may be used as an independent optimization from the voltage-latency relation described above. The dissipated power of NAND Flash memory is:

$$P_{NAND} = V_{NAND} \cdot I_{NAND} = \frac{V_{NAND}^2}{R_{NAND}} \quad \text{(Eqn. 8)}$$

The equivalent parameter is estimated using a conventional supply voltage and reported power as generally shown in NAND specifications:

$$R_{NAND} = \frac{V_{NAND}^2}{P_{NAND}} = \frac{3.3^2}{175 \cdot 10^{-3}} = 62.2286[\Omega] \quad \text{(Eqn. 9)}$$

We can mark $t_{PROG\text{-}TLC}$ as $t_{PROG}$. The program bandwidth in MB/second should be optimized according to the number of levels per cell, which is here the 4-levels of MLC. Since we may not have a voltage-latency relation for SLC and TLC, we may assume usage of E-MLC (number of levels L=4) for backup data for a feasibility study:

$$T_{SEQ} \approx \frac{S_B}{W_2 \cdot N_{Ch} \cdot N_{Wy} \cdot N_{Pn}} \cdot \frac{t_{PROG}}{\log_2(L)} + 2 \cdot t_{PROG} \quad \text{(Eqn. 10)}$$

Therefore:

$$E_{SPOB} = P_{REQ} \cdot T_{REQ} \quad \text{(Eqn. 11)}$$

$$= \left( \frac{S_E}{W_Z \cdot N_{Ch} \cdot N_{Wy} \cdot N_{Pn} \cdot \log_2(L)} + 2 \right) t_{PROG} \cdot \cdot$$

$$\left( P_{DEAM} + P_{CTR} + N_{Ch} \cdot N_{Wy} \cdot N_{Pn} \cdot \frac{V_{NAND}^2}{R_{NAND}} + P_{LINK} \right)$$

Since $t_{PROG}$ is a function of V-NAND, and all other parameters are substantially constants, we can formulate the SSD energy minimization as the optimization problem:

$$E_{Min} = \min_{V_{NAND}} E_{SPOB}(P_{REQ}, T_{REQ}) \quad \text{(Eqn. 12)}$$

Numerical analysis may be performed for finding the global minimum extreme. Referring back to FIG. 1, the optimization scheme was selected in order to reduce capacitor requirements for sudden power loss backup using an alternative low-power program flow embodiment. The scheme is summarized as follows:

Algorithm 1: Optimization for Backup-Energy Reduction
Input: D—page data bits, P$_Z$—page size (# of bits);
(1) Choose BPC mode that minimizes Power per Bit-Write;
(2) Set initial voltage to 3.3 V;
(3) Adjust minimal voltage scaling to 2.0 V;
(4) Program buffer to super-pages and check R/B # for each NAND to consider modified latency.

In step (1), we choose among cell-level configurations (SLC, MLC, TLC) according to optimized energy per bit program. In steps (2) and (3), we set the capacitor voltages to include a potentially wider range. In the next analysis, we show that 2.0 V achieves a minimal write energy. Step (4) includes additional checks of the NAND status during programming since the latency was modified to reduce energy dissipation. FIG. 4 shows the reduction in programming energy according to voltage scaling using the equations that were developed above. Results show reduction of 35% to 52% in write energy according to the scaled voltage. For ease of explanation, these results do not reflect the additional energy savings from using fewer bits per cell.

Referring back to FIG. 3, the Programming Latency vs. NAND Voltage scaling demonstrates a trade-off in Flash write operations. Here, the voltage is reduced from 3.3 V to a target voltage that varies from 2.6 V to 2.0 V after a time interval from the start of program operation. We observe an increase in write latency as voltage is reduced, as expected. The polynomial regression that describes the function is shown in Table D.

Polynomial Regression of Latency-Voltage Relation results for 1.8 V; 1.9 V; 2.0 V; 2.1 V; 2.2 V; 2.3 V; 2.4 V; 2.5 V; 2.6 V; and 3.3 V were shown in Table D. It shall be understood that 1.8 V and 1.9 V are valid voltages only from a time interval that is greater than 600 μSec, or page errors may be uncorrectable. Since such an extended time interval would require additional energy, the 2.0 V voltage was the most energy-efficient. R2 is the coefficient of determination reflecting how well the regression fits the actual data, and is between 0 and 1 where 0 is unrelated and 1 is a perfect fit. It is defined by:

$$R^2 = 1 - \frac{\sum_i (y_i - f_i)^2}{\sum_i (y_i - \bar{y})^2} \quad \text{(Eqn. 13)}$$

Where $y_i$ is the measured value, $f_i$ is the predicted value from the regression function, and y-bar is the average of all measurements. Referring back to FIG. 4, normalized backup energy for 8-channel 8-way SSD is shown in the current NAND nominal voltage (3.3 V) and in the proposed scaled NAND voltage (2.0 V to 2.6 V). The analysis relies on the model that was developed above. The powered portions include DRAM, controller, link and NAND components. We observe 35% to 52% reduction in backup energy requirements depending on the selected power-off supply voltage(s). The graph does not include the further potential energy reduction due to selection of SLC/MLC/TLC for capacity versus latency trade-offs since those are technology specific and should be considered on per-product basis.

In a preferred embodiment SSD, the voltage supply to the NAND and related components is reduced during power-off, such that write speed may be degraded but the important factor of energy consumption is reduced, and the SSD enabled to store large amounts of volatile data into its non-volatile flash memory using less energy during power-off. We also checked two additional approaches for SSD power reduction: DRAM power shutdown after read and NAND data shaping to decrease the amount of high charge levels. Both of these additional techniques showed low relative impact on the total SSD power requirements during power-off.

In alternate embodiments, a reduced NVM supply voltage waveform is provided to an internal NVM when an external power reduction or loss occurs. Here, the reduced NVM supply is different from a normal NVM supply that is provided during normal powered operation.

Enterprise data storage market demands center on high performance. SSD incorporate DRAM cache buffer for supporting fast host transactions and meta-data management. Along with the increase in processing speed and SSD components, additional cache size is required to handle data buffer and management. In order to prevent data loss during sudden power-off, enterprise SSDs contains backup capacitors that provide a temporary power source and enable programming of DRAM data to NVM Flash during this critical period. The component and test costs of the capacitor are already relatively high and are projected to increase even further. In order to reduce backup capacitor requirements, the present disclosure provides a low-power program scheme to be activated during sudden power-off.

The approach may use complementary techniques: NAND voltage scaling that trades off write performance for energy per bit programmed, and optionally bits-per-cell (SLC/MLC/TLC) mode selection to trade off capacity for energy per bit programmed. Analysis based on NAND under-power experiments shows reduction of at least 52% in backup energy without compromising reliability. The preferred embodiment features include setup of the power management integrated circuit at the SSD board and appropriate firmware support.

The proposed scheme may also be extended to ultra-low power applications such as mobile or space data-storage systems, where it may be implemented during other reduced power operation scenarios such as when light to a solar panel is blocked and/or limited power is needed for other subsystems. The presently disclosed method provides opportunities for cost reduction, improved profit margin, increased reliability, and/or extension to previously inhospitable environments for high-performance fault-tolerant storage systems.

Figure 5:
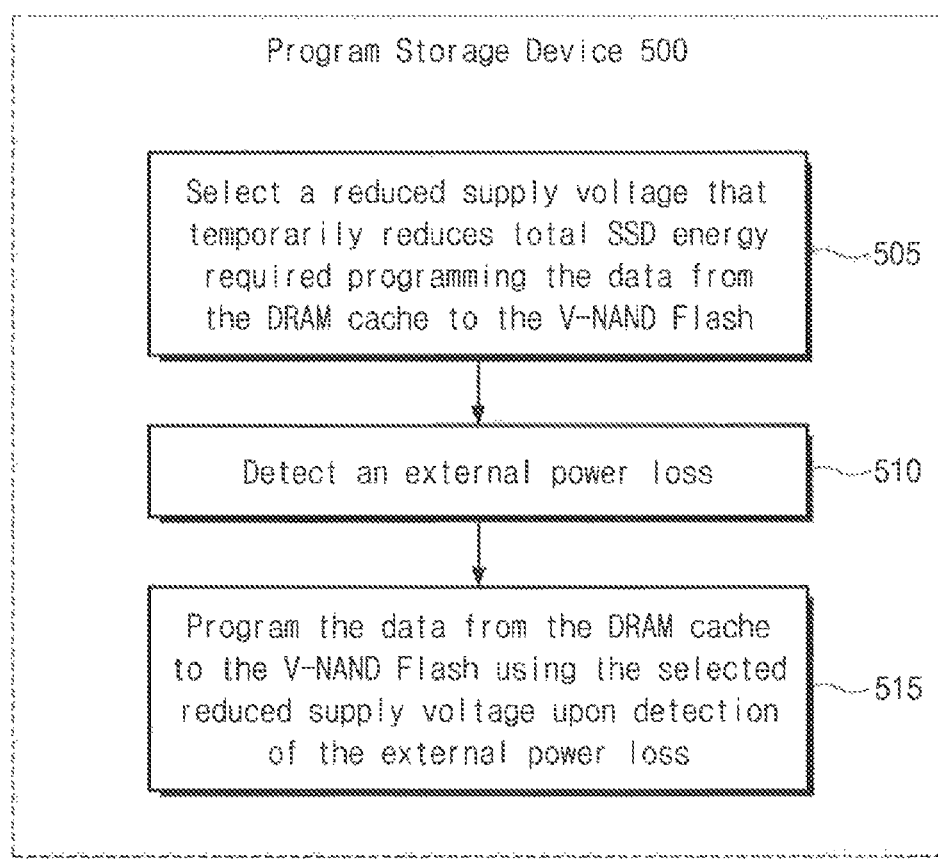
FIG. 5 shows a program storage device including instructions for programming data in an SSD from a DRAM cache to a V-NAND Flash.

FIG. 5 shows a program storage device 500 including instructions for programming data in an SSD from a DRAM cache to a V-NAND Flash. Program storage device 500 tangibly embodies a program of instruction steps executable by a processor for programming data in an SSD from a DRAM cache to a V-NAND Flash. Block 505 shows the instruction step of selecting a reduced supply voltage that temporarily reduces total SSD energy required for programming the data from the DRAM cache to the V-NAND Flash. Block 510 shows the instruction step of detecting an external power loss. Block 515 shows the instruction step of programming the data from the DRAM cache to the V-NAND Flash using the selected reduced supply voltage upon detection of the external power loss.

Although exemplary embodiments of the present disclosure have been shown and described, it shall be understood that those of ordinary skill in the pertinent art may make changes therein without departing from the principles, scope or spirit of the inventive concept as defined by the appended claims and their equivalents.

What is claimed is:

1. A program storage device tangibly embodying a program of instruction steps executable by a processor for programming data in a solid-state drive (SSD) from a DRAM cache to a V-NAND Flash, the instruction steps comprising:
   reducing a supply voltage for the V-NAND flash by a step from an upper supply voltage to a lower limit supply voltage;
   saving a plurality of latencies for programming the data according to a plurality of reduced supply voltages from the upper supply voltage to the lower limit supply voltage;
   selecting a temporarily reduced supply voltage from among the plurality of reduced supply voltages based on the plurality of latencies;
   detecting an external power loss; and
   programming the data from the DRAM cache to the V-NAND Flash using the selected reduced supply voltage upon detection of the external power loss.

2. The program storage device of claim 1, the instruction steps further comprising:
   selecting the reduced supply voltage that temporarily reduces total SSD energy required for programming the data from the DRAM cache to the V-NAND Flash to that available from a super-capacitor of the SSD.

3. The program storage device of claim 1, the instruction steps further comprising:
   selecting a bits-per-cell (BPC) mode that temporarily minimizes energy per bit-write to the V-NAND Flash; and
   programming the data from the DRAM cache to the V-NAND Flash using the selected BPC mode and reduced supply voltage during power loss to the SSD.

4. The program storage device of claim 3, the instruction steps further comprising:
   detecting a stressful temperature condition within the SSD; and
   invoking temperature protection by adjusting at least one of the BPC mode or supply voltage to protect the cache data and mitigate the stressful temperature condition using the adjusted BPC mode or supply voltage.

5. The program storage device of claim 3, the instruction steps further comprising:
   writing the DRAM cache data to a portion of the V-NAND Flash requiring the lowest write duration for the current temperature, BPC, or supply voltage.

6. The program storage device of claim 1, the instruction steps further comprising:
   detecting a power loss to the SSD;
   determining the energy requirements of the active incomplete processes of the SSD; and
   selecting the reduced supply voltage that temporarily reduces total SSD energy required for programming the data from the volatile buffer to the V-NAND Flash to that available from a capacitor of the SSD less that required for the active incomplete processes.

7. The program storage device of claim 1, the instruction steps further comprising:
   adjusting the V-NAND flash voltage scaling at least once during power-loss to extend capacitor power for programming of cache data based on a latency versus power trade-off that leads to minimal energy consumption.

8. The program storage device of claim 1, the instruction steps further comprising:
   adjusting supply voltage scaling for read from DRAM and again for write to V-NAND Flash during a reduced-power mode to extend capacitor power for programming of cache data based on a latency versus power trade-off.

9. The program storage device of claim 1, the instruction steps further comprising:
   extending on-SSD capacitor lifetime by providing chip power scaling and low-power programming to reduce at least one of temperature cycling or energy cycling of the capacitor.

10. The program storage device of claim 1, the instruction steps further comprising:
    performing expedited DRAM data programming to V-NAND without a verification operation.

11. A method for programming data from a volatile buffer to a non-volatile memory (NVM), comprising:
    reducing a supply voltage for the NVM by a step from an upper supply voltage to a lower limit supply voltage;
    saving a plurality of latencies for programming the data according to a plurality of reduced supply voltages from the upper supply voltage to the lower limit supply voltage;
    selecting a temporarily reduced supply voltage from among the plurality of reduced supply voltages based on the plurality of latencies, wherein the temporarily reduced supply voltage comprises a voltage required for writing data to the NVM;
detecting a power loss; and
writing data to the NVM using the selected reduced supply voltage upon detection of the power loss.

12. The method of claim 11 wherein the NVM uses a variable number of bits per cell (BPC), further comprising:
reducing the number of BPC used in the NVM to write data during the temporary mode; and
storing meta-data in the NVM indicative of the reduced number of BPC.

13. The method of claim 11 wherein the volatile buffer and the NVM are comprised by a solid-state drive (SSD).

14. The method of claim 11 wherein the volatile buffer comprises a dynamic random-access memory (DRAM).

15. The method of claim 11 wherein the NVM comprises NAND Flash storage.

16. The method of claim 11 wherein the NVM comprises V-NAND Flash technology.

17. The method of claim 11 wherein the selected reduced supply voltage is supplied by a capacitor.

18. A solid-state drive (SSD) comprising:
a volatile buffer;
a non-volatile memory (NVM) connected to the volatile buffer; and
a capacitor connected to both the volatile buffer and the NVM,
wherein the SSD comprises a normal powered mode and a temporary power loss mode based on an extended latency and a reduced supply voltage, and the capacitor has an energy capacity insufficient to supply the volatile buffer and NVM using a normal supply voltage in the normal powered mode, but sufficient to supply the buffer and NVM using the extended latency and the reduced supply voltage in the temporary power loss mode,
wherein the reduced supply voltage is selected from among a plurality of reduced supply voltages based on a plurality of latencies for programming data from the volatile buffer to the NVM.

19. The SSD of claim 18 wherein the NVM includes a variable number of levels per cell.

20. The SSD of claim 19, further comprising:
circuitry for reducing the number of levels per cell used in the NVM to write data during the temporary mode; and
circuitry for storing meta-data in the NVM indicative of the reduced number of levels per cell.

* * * * *